United States Patent [19]
Kingston et al.

[11] Patent Number: 5,982,821
[45] Date of Patent: Nov. 9, 1999

[54] FREQUENCY DISCRIMINATOR AND METHOD AND RECEIVER INCORPORATING SAME

[75] Inventors: Samuel C. Kingston; Steven T. Barham, both of Salt Lake City; Sharen Wirkus, Sandy, all of Utah

[73] Assignee: L-3 Communications, Salt Lake City, Utah

[21] Appl. No.: 08/951,233

[22] Filed: Oct. 16, 1997

Related U.S. Application Data

[63] Continuation of application No. 08/585,616, Jan. 16, 1996.

[51] Int. Cl.[6] .................................................. H04L 27/14
[52] U.S. Cl. .......................... 375/326; 375/344; 329/323; 329/343; 329/315
[58] Field of Search .................................... 375/326, 344, 375/317, 375; 329/323, 343, 315

[56] References Cited

U.S. PATENT DOCUMENTS

| | | | |
|---|---|---|---|
| 4,163,951 | 8/1979 | Aihara et al. ................................. | 331/1 |
| 4,286,223 | 8/1981 | Shearer ....................................... | 329/50 |
| 4,656,431 | 4/1987 | Chapman .................................... | 329/50 |
| 4,728,957 | 3/1988 | Hethuin ...................................... | 342/401 |
| 4,985,684 | 1/1991 | Jentz et al. ................................. | 329/327 |
| 5,022,048 | 6/1991 | Kingston et al. ............................ | 375/1 |
| 5,103,459 | 4/1992 | Gilhousen et al. . | |
| 5,105,437 | 4/1992 | Kingston et al. . | |
| 5,280,538 | 1/1994 | Kataoka et al. ............................. | 375/1 |
| 5,295,152 | 3/1994 | Gudmundson et al. . | |
| 5,519,389 | 5/1996 | DeGunther et al. ................ | 340/870.29 |
| 5,544,155 | 8/1996 | Lucas et al. . | |
| 5,585,761 | 12/1996 | Lamberg et al. ........................ | 329/304 |

FOREIGN PATENT DOCUMENTS

| | | |
|---|---|---|
| 0 630 120 A1 | 12/1994 | European Pat. Off. . |
| 0 654 913 A2 | 5/1995 | European Pat. Off. . |
| WO 92/02083 | 2/1992 | WIPO . |

*Primary Examiner*—Stephen Chin
*Assistant Examiner*—Mohammad Ghayour
*Attorney, Agent, or Firm*—Perman & Green, LLP

[57] ABSTRACT

Apparatus and method for digital frequency discrimination are provided that only require one sample per data symbol (e.g. one bit for BPSK or 2 bits for QPSK). This is accomplished by determining the difference between the carrier phase error on successive data symbols. The difference in phase error is then used as an approximation to the derivative of the phase error, which is the frequency error between the carrier and the local oscillator of the receiver. An important advantage of this apparatus and method is that they allow the maximum symbol rate to be processed by the receiver for a given digital technology. In other words, maximum symbol rate can now be equal to the maximum clock rate of the digital technology, if so desired by the user. In contrast, conventional digital frequency discriminators limit the maximum symbol rate to one-half or one-fourth of the maximum clock rate for a given digital technology. A key feature is the use of a threshold apparatus and method that allows the discriminator to ignore phase shifts that are due to data modulation, and only use phase shifts that are due to carrier frequency errors. Thus, when successive data symbols are identical, frequency error information can be obtained for carrier recovery. When successive data symbols are different, no updates are made to the carrier recovery. This allows a carrier recovery loop to operate at a rate of one sample per data symbol.

114 Claims, 5 Drawing Sheets

FREQUENCY DISCRIMINATOR AND METHOD AND RECEIVER INCORPORATING SAME

This is a continuation of copending application Ser. No. 08/585,616 filed on Jan. 16, 1996.

FIELD OF THE INVENTION

The present invention relates to communications such as pulse or digital commnunications, and more particularly to phase shift keyed communications, such as binary phase shift keying (BPSK) or quadriphase shift keying (QPSK). The present invention also relates to wireless communications systems and methods, and more particularly to digital frequency discrimination for same. The present invention still further relates to demodulators, and more particularly to frequency discriminators.

BACKGROUND OF THE INVENTION

One of the functions that is required in a digital communications receiver or digital demodulator is to acquire and track the frequency error between the carrier that is being used to transmit the information and the local oscillator signal of the receiver. Frequency tracking is required in order to perform demodulator functions such as non-coherent data demodulation, or as a preliminary step prior to carrier phase acquisition and tracking. Thus, there is a need to perform carrier frequency discrimination. The present invention fulfills this need.

Various digital communications systems are known. For example, see U.S. Pat. No. 5,060,180 issued Oct. 22, 1991 for "Programmable Digital Loop Filter" by Samuel C. Kingston et al; U.S. Pat. No. 4,841,552 issued Jun. 20, 1989 for "Digital Phase Shifter" by Samuel C. Kingston; and U.S. Pat. No. 5,022,048 issued Jun. 4, 1991 for "Programmable Digital Frequency-Phase Discriminator" by Samuel C. Kingston et al, each of which is hereby incorporated by reference herein.

In Kingston et al '180, a programmable second order loop filter is provided with first and second programmable scaling circuits arranged in parallel and having their outputs connected to first and second programmable one bit serial adders respectively. The output of the second programmable serial adder is coupled to the input of the first programmable serial adder and has its output coupled to the input of a programmable output stage so as to provide the ability to maintain the average quantization bit error to one-half of one bit of the least significant bit of the full loop filter width even though the output does not use or employ all of the significant bits. FIG. 2 of the Kingston et al '180 patent shows a phase-locked loop employing a clock synthesizer 77 and passing through receiver stages 10, demodulator 54, line 55, switch 67, line 76, clock synthesizer 77, line 78, master clock or system clock 72, line 73, timing and control circuit 74 and line 53 applied to the clock input of receiver stages 10.

Kingston '552 describes a digital phase shifter for accomplishing digital phase shifting without the requirement of complex multiplication. The phase shifter includes buffer registers for receiving and storing the inphase and quadrature components of a complex number and for storing in a phase command register the information indicative of the phase shift to be accomplished. The phase shifting apparatus comprises a command map for generating a plurality of plus or minus phase shift command bits. A plurality of plus or minus phase shift registers are coupled to the phase shift command bits for performing plus or minus phase shifts of predetermined angles that diminish by a factor of approximately one-half from the previous phase shift angle.

Kingston et al '048 describes a frequency-phase discriminator that has input channels for real and imaginary data which are coupled to two programmable despreaders. The first despreader has its real and imaginary outputs coupled to individual programmable data rate filters which have their individual outputs coupled to a quadrant detector that generates a phase angle direction signal and sign magnitude. The second despreader has its real and imaginary outputs connected through individual programmable inverters to data rate filters which have their individual outputs coupled to a quadrant selector that selects error signal data rate information from one of four quadrant axes signals. A command generator is programmably coupled to the output of the quadrant detector into the input of the quadrant selector and provides a selection signal to the quadrant selector which produces a frequency error signal output employed in a frequency lock loop or in a phase lock loop.

A conventional method for digital frequency discrimination typically requires at least two samples per data bit. An example of this kind of frequency discriminator can be found in U.S. Pat. No. 5,022,048 to Kingston et al, described above.

One of the challenges in performing carrier recovery in digital communication systems is the fact that binary data is used to modulate the carrier, so that the data modulation needs to be removed in order to estimate the carrier frequency error. For this reason, in conventional systems, multiple samples are taken per data bit so that the data is constant for each of those samples. The data can then be estimated and removed from those samples before performing frequency error estimation. However, this approach requires multiple samples per bit which lowers the allowable bit rate that can be processed by the receiver to say one-half to one-fourth of the sample rate.

Carrier frequency acquisition, or automatic frequency control (AFC), poses a particular challenge for the case of high-rate unspread signals. In order to aid in carrier acquisition, a prior art practice is to employ a frequency detector that can be used as part of an AFC loop to pull-in the carrier frequency to within the acquisition range of the carrier phase lock loop.

This prior art frequency detector utilizes part of an AFC loop and requires at least two samples per symbol to operate. The carrier frequency error is the derivative of the carrier phase error. Accordingly, the frequency error detector computes an estimate of the derivative of the carrier phase error. This estimate is determined by using the following approximation:

$$\left.\frac{d(\phi(t))}{dt}\right|_{t=kT} \approx \frac{\left(\hat{\phi}(kT) - \hat{\phi}\left(kT - \frac{T}{2}\right)\right)}{T/2} \quad (1)$$

Where
T is the symbol period
$\phi(t)$ is the carrier phase,
$\hat{\phi}(kT-T/2)$ is the estimated carrier phase at time $t=kT-T/2$, and
$\hat{\phi}(kT)$ is the estimated carrier phase at time $t=kT$ (i.e., for the kth symbol).

This detector uses a data-aided method that uses hard data estimates to remove the effect of data modulation from the phase estimates. Two samples per symbol are required so that a single data decision can be applied to remove the data from both phase estimates.

However, in order to use this detector, a minimum of two samples per symbol are required. However, high rate unspread signals operate at one sample per data symbol. Especially for that case, a frequency detector that can operate at a rate of one sample per symbol is required. The present invention fulfills this need.

SUMMARY OF THE INVENTION

Accordingly, an object of the present invention is to provide apparatus and method for carrier frequency recovery for a digital demodulator or for digital demodulation. Another object of the present invention is to provide digital implementation of carrier frequency recovery, which implementation needs only one sample per data symbol.

A further object of the present invention is to provide a low cost digital frequency discriminator and method that supports higher data rates than prior art digital discriminators.

Still another object of the present invention is to provide apparatus and method for performing carrier frequency discrimination.

A still further object of the present invention is to provide apparatus and method for carrier frequency acquisition and tracking.

Briefly, these and other objects of the present invention are accomplished by novel apparatus and method for digital frequency discrimination that only require one sample per data symbol (e.g. one bit for BPSK or 2 bits for QPSK). This is accomplished by determining the difference between the carrier phase error on successive data symbols. The difference in phase error is then used as an approximation to the derivative of the phase error, which is the frequency error between the carrier and the local oscillator of the receiver. An important advantage of this apparatus and method is that they allow the maximum symbol rate to be processed by the receiver for a given digital technology. In other words, maximum symbol rate can now be equal to the maximum clock rate of the digital technology, if so desired by the user. In contrast, conventional digital frequency discriminators limit the maximum symbol rate to one-half or one-fourth of the maximum clock rate for a given digital technology.

A key feature is the use of a threshold apparatus and method that allows the discriminator to ignore phase shifts that are due to data modulation, and only use phase shifts that are due to carrier frequency errors. Thus, when successive data symbols are identical, frequency error information can be obtained for carrier recovery. When sucessive data symbols are different, no updates are made to the carrier recovery. This allows a carrier recovery loop to operate at a rate of one sample per data symbol.

Other objects, advantages and novel features of the invention will become apparent from the following detailed description of the invention when considered in conjunction with the accompanying drawings.

DESCRIPTION OF THE PREFERRED EMBODIMENT

Figure 1:
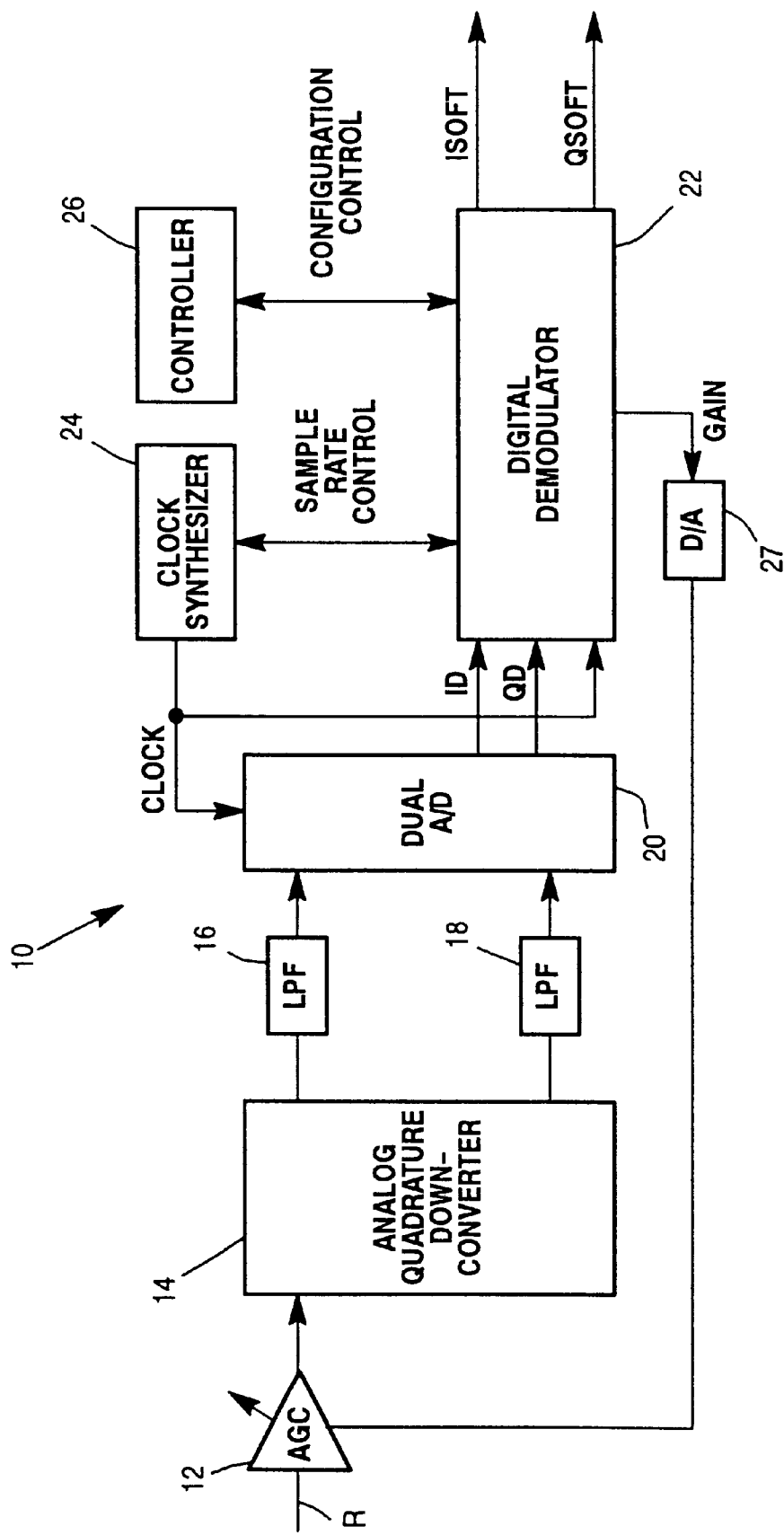
FIG. 1 is a schematic block diagram of a prior art demodulation system or receiver.

Referring now to the drawings, wherein like reference characters designate like or corresponding parts throughout the several views, there is shown in FIG. 1 a prior art demodulator 10 wherein a received signal R to be demodulated is applied to the input of automatic gain control (AGC) 12. The output of automatic gain control 12 is provided to analog quadrature downconverter 14. Analog quadrature downconverter 14 in response produces two outputs in quadrature relationship, each of which is applied to a respective low pass filter 16 or 18. The low pass filtered signals produced by low pass filters 16 and 18 are then applied to dual analog to digital converter (ADC) 20. Two physically separate analog to digital converters could be used instead of a dual analog to digital converter. The input of one analog to digital converter is connected to the output of filter 16. The input of the other analog to digital converter is connected to the output of filter 18. The digitized quadrature signals ID and QD produced by dual analog to digital converter 20 are applied to digital demodulator 22, which demodulates those signals and produces in response data signal ISOFT and data signal QSOFT. Digital demodulator 22 also produces an AGC control signal which is provided to control the AGC 12. Clock synthesizer 24 provides a clock signal to dual analog to digital converter 20, and receives sample rate control from digital demodulator 22. Controller 26 provides configuration control to digital demodulator 22. The system of FIG. 1 can be used to demodulate phase shift keyed signals such as BPSK or QPSK. Digital demodulator 22 performs frequency detection according to expression (1) above.

Figure 2:
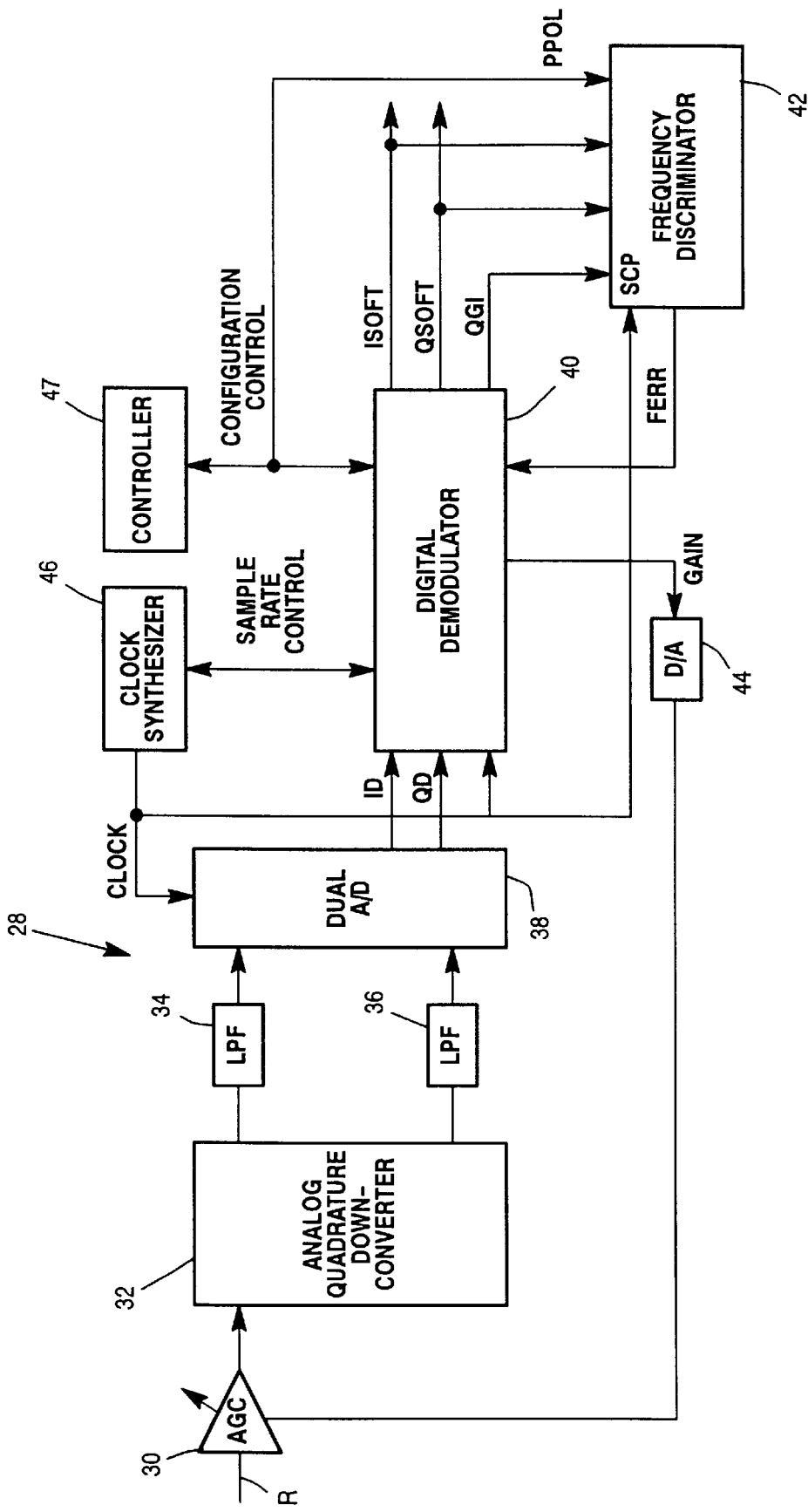
FIG. 2 is a schematic block diagram of a demodulation system or receiver according to the present invention including a frequency discriminator according to the present invention.

There is shown in FIG. 2 a preferred embodiment of a receiver or demodulation system 28 according to the present invention. In demodulation system 28, a received signal R to be demodulated is applied to the input of automatic gain control (AGC) 30. The output of automatic gain control 30 is applied to the input of analog quadrature downconverter 32. Analog quadrature downconverter 32 in response produces two output signals in quadrature relationship, each of which output signals is applied to a respective low pass filter 34 or 36. The low pass filtered signals produced by low pass filters (such as RC filters) 34 and 36 are then applied to dual analog to digital converter 38. Dual analog to digital converter 38 converts the two analog low pass filtered signals from filters 34 and 36 respectively to corresponding digital signals ID and QD. The dual ADC 38 acts as two analog to digital converters. Alternatively, two physically separate analog to digital converters can be utilized here instead of a dual analog to digital converter. The input of one analog to digital converter is connected to the output of filter 34. The input of the other analog to digital converter is connected to the output of filter 36. The digitized signals ID and QD produced by dual analog to digital converter 38 are provided to digital demodulator 40. Demodulator 40 determines whether the magnitude of digital signal QSOFT is greater than the magnitude of digital signal ISOFT, and produces a signal QGI indicative thereof. Digital demodulator 40 also produces demodulated signals ISOFT and QSOFT, which are demodulated versions of signals ID and QD respectively. Signals ISOFT, QSOFT and QGI are provided to frequency discriminator or frequency detector 42. In response to signals ISOFT, QSOFT, QGI and PPOL, frequency discriminator 42 determines whether a carrier frequency error is present, and provides a signal FERR to digital demodulator 40 indicative thereof. Digital demodulator 40 also produces signal GAIN, which is then passed through digital to analog converter 44 whose output is provided to control the AGC 30. Clock synthesizer 46 clocks dual analog to digital converter 38 and frequency discriminator 42, and receives sample rate control from digital demodulator 40. Controller 47 provides configuration control to digital demodulator 40.

Frequency discriminator 42 is a single-sample-per-symbol frequency discriminator or frequency detector that can be used in conjunction with digital demodulator 40.

In FIG. 2, the received signal R is received on the left side of the figure. The received signal is passed through a variable gain amplifier 30 and then goes into a quadrature downconverter 32. Downconverter 32 contains a local oscillator which is close in frequency to the frequency of the carrier signal, but not necessarily exactly the same frequency as that of the carrier signal. This results in a complex baseband signal which still has some residual frequency error on it due to the difference between the carrier frequency and the frequency of the local oscillator inside quadrature downconverter 32. This carrier frequency error is the frequency that is estimated and removed using the carrier recovery loop shown in FIG. 2.

In system 28 of FIG. 2, the complex baseband signals are respectively filtered by low pass filters 34 and 36 respectively. The filtered signals are then sampled and quantized by respective analog-to-digital converters. These analog to digital converters 35 and 37 can be implemented as a single dual analog to digital converter 38. The resulting digital data signals ID and QD are then passed to a digital demodulator 40. Digital demodulator 40 recovers the data modulation, but in order to do that, digital demodulator 40 must first remove the residual frequency error that is referred to above. This removal is accomplished by frequency detector or discriminator 42. The inputs to discriminator 42 are ISOFT and QSOFT data coming out of demodulator 40 and also QGI, which is a Q greater than I indicator indicating whether the magnitude of QSOFT is greater than the magnitude of ISOFT. In response to signals ISOFT, QSOFT and QGI provided thereto, discriminator 42 estimates the carrier frequency error and produces a signal FERR that is proportional to that frequency error. Signal FERR is shown on the line going back into digital demodulator 40. Signal FERR is an error signal that can be applied via multiplexer 62 (if selected thereby) to a loop filter 48 (shown in FIG. 3) both inside digital demodulator 40 to filter noise from the error signal. The filtered output of loop filter 48 is then connected to a digital phase shifter 50 inside digital demodulator 40 to remove the residual frequency error from the signal as shown in FIG. 3.

Figure 3:
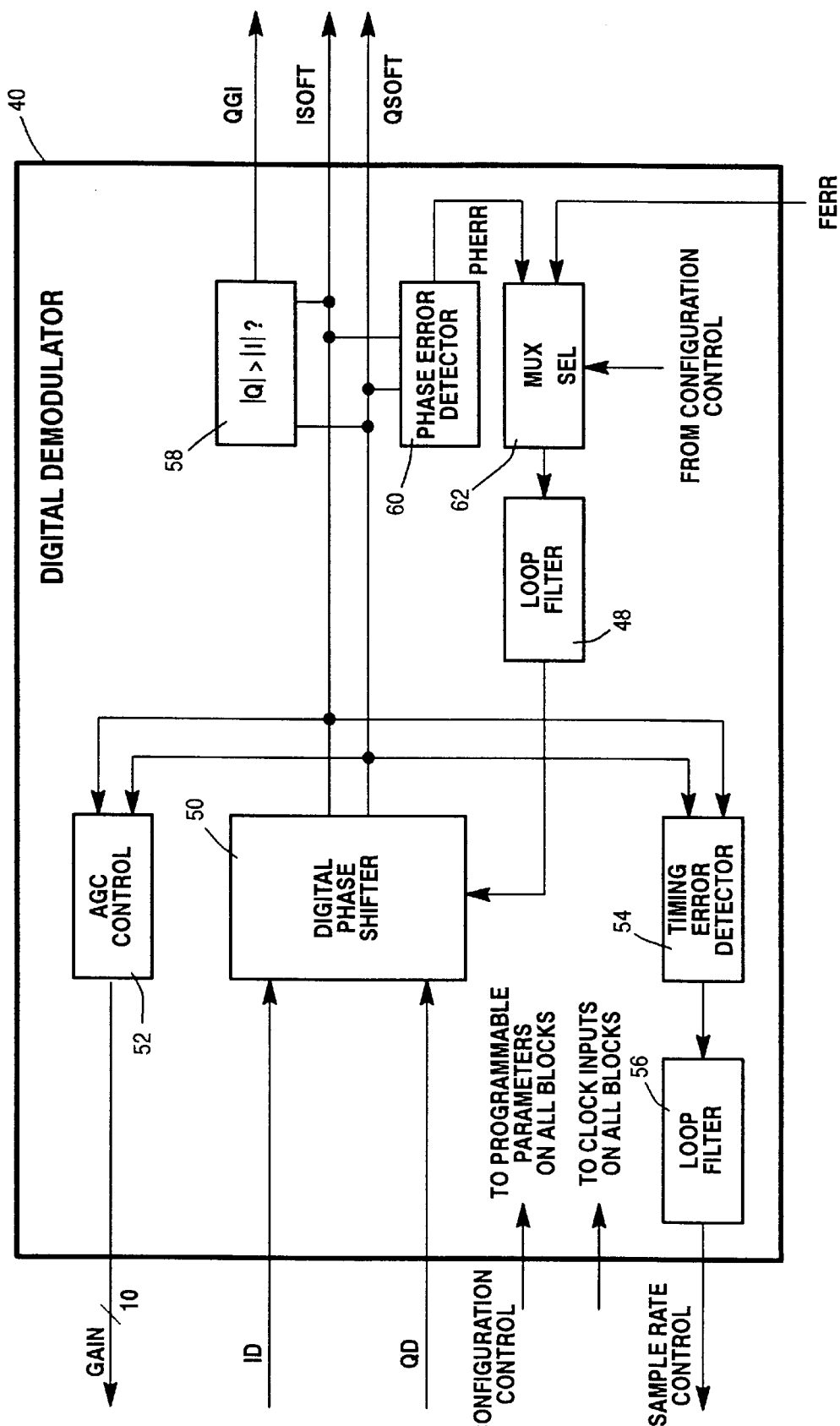
FIG. 3 is a more detailed schematic block diagram of a portion of the system of FIG. 2 showing the digital demodulator of FIG. 2 in greater detail.

FIG. 3 illustrates digital demodulator 40 in greater detail. As shown in FIG. 3, digitized signals ID and QD from respective analog to digital converters (shown as a dual ADC 38) are provided to digital phase shifter 50. Signals ID and QD can optionally be prefiltered by respective FIR filters (not shown) before being provided to digital phase shifter 50. Digital phase shifter 50 produces signals ISOFT and QSOFT which have been shifted in phase if necessary. Signals ISOFT and QSOFT are produced by digital demodulator 40. Signals ISOFT and QSOFT are also provided to AGC control 52 which checks the amplitude of those signals against a preset threshold and produces signal GAIN in response. Signal GAIN is then digitized by digital to analog converter 44 of FIG. 2 and is then provided to AGC 30 as the control signal for AGC 30. Signals ISOFT and QSOFT are also provided to timing error detector 54 which determines whether a timing error is present. The signal produced by timing error detector 54 is then passed through a loop filter 56 to produce a sample rate control signal which is then provided to clock synthesizer 46. Signals ISOFT and QSOFT are also provided to magnitude comparison component or comparer 58. Comparer 58 compares the absolute value of the magnitude of signal QSOFT with the absolute value of the magnitude of signal ISOFT and produces a signal QGI indicative thereof. Signal QGI is then provided to frequency discriminator 42. Signals ISOFT and QSOFT are also provided to phase error detector 60. Phase error detector 60 determines whether signals ISOFT and QSOFT are in the proper phase relationship, and produces a signal PHERR indicative thereof. Signal PHERR from phase error detector 60, and signal FERR from frequency discriminator 42, are provided to multiplexer 62. Multiplexer 62 provides either signal PHERR or signal FERR to loop filter 48 to control digital phase shifter 50. Signal FERR is provided to loop filter 48 first; signal PHERR is used thereafter for finer corrections.

Data signals ISOFT and QSOFT produced by demodulator 40 are the same signals as the corresponding inputs ID and QD provided to demodulator 40 except that inside demodulator 40 there is a digital phase shifter 50, such as the one described by U.S. Pat. No. 4,841,552 by Kingston, which removes the carrier frequency error that is referred to above. This is shown in FIG. 3. Thus, if the loop of FIGS. 2 and 3 is working correctly, the carrier frequency error is reduced or nearly totally removed and would not be present on the data signals ISOFT and QSOFT produced by demodulator 40. However, if the carrier frequency error is not perfectly removed, then there will be some residual error on the ISOFT and QSOFT output lines which is then measured by frequency discriminator 42; that measurement is then used to provide a correction factor to loop filter 48 and therefrom to digital phase shifter 50 inside demodulator 40. System 28 therefore attempts to track any changes in the carrier frequency and continuously seeks to remove the frequency error from the data.

Referring again to FIGS. 2 and 3, it is also necessary to estimate the exact timing of the data modulation. This is accomplished in a timing recovery circuit or timing error detector such as can be found in many digital demodulators. The timing recovery loop including digital phase shifter 50, timing error detector 54, loop filter 56 and clock synthesizer 46 includes a timing error detector 54 and a loop filter 56 as depicted in FIG. 3, and a programmable clock synthesizer 46 shown in FIG. 2. This timing recovery loop adjusts the exact time of the samples, or the exact sampling times, so that they correspond to the symbol transitions of the received waveform. An AGC control circuit 52 is also included, as shown in FIG. 3, which produces a gain signal to control the variable gain amplifier 30 shown in FIG. 2.

Referring again to FIG. 2, system 28 includes a controller 47 that can program and configure digital demodulator 40, and receive status information. Multiplexer 62 is controlled by controller 47 to provide signal FERR to loop filter 48 to get the error small, and thereafter to provide signal PHERR to loop filter 48 for finer correction. Signal PPOL (which can be a control bit), and the threshold for conditioning logic 74, can each be provided by controller 47 to discriminator 42 via the configuration control bus.

Figure 4:
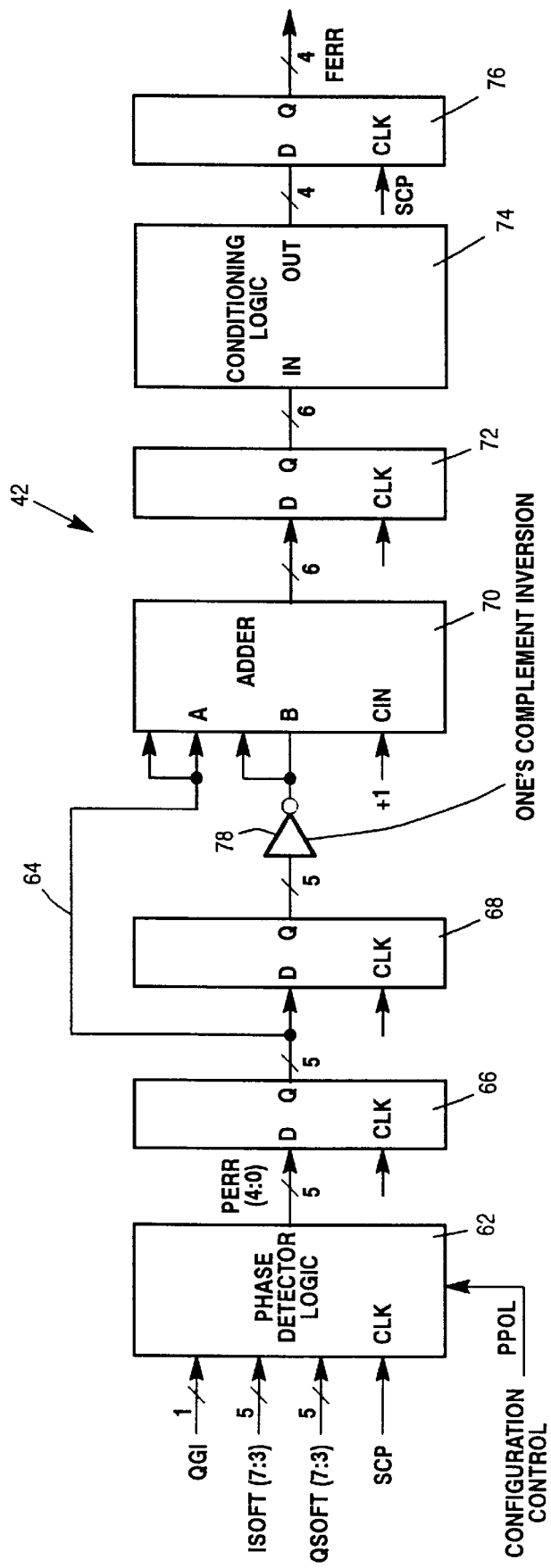
FIG. 4 is a more detailed schematic block diagram of a portion of the system of FIG. 2 showing a preferred embodiment of a frequency discriminator that can be utilized in the system of FIG. 2.

FIG. 4 shows frequency discriminator 42 of FIG. 2 in greater detail. As shown in FIG. 4, frequency discriminator 42 includes phase detector logic 62, flipflops or registers 66, 68, 72, adder 70, conditioning logic 74 and a D-type flipflop or register 76 which holds and produces signal FERR. Phase detector logic 62 receives signals QGI ISOFT, QSOFT and PPOL from demodulator 40, and system clock pulse SCP from clock synthesizer 46. In response to input signals PPOL and QGI, phase detector logic 62 produces a signal PERR corresponding to what is shown in Table 1 below.

TABLE 1

Phase Detector Logic

| PPOL | QGI | PERR |
|---|---|---|
| 0 | 0 | SGNI ⊕ QSOFT |
| 0 | 1 | $\overline{SGNQ \oplus ISOFT}$ |
| 1 | 0 | $\overline{SGNI \oplus QSOFT}$ |
| 1 | 1 | SGNQ⊕ISOFT |

SGNI = sgn(ISOFT)
SGNQ = sgn(QSOFT)

Registers or D-type flipflops 66, 68, 72 and 76 are clocked by clock signal SCP from clock synthesizer 46. Register 68 receives signal PERR, and provides it via bypass 64 to adder 70. Adder 70 is here a 6 to 8 adder. The carry-in input CIN of adder 70 is held to a value of plus 1. Inverter 78 is used to perform a ones complement inversion. Register 68 and adder 70 together convert the phase error signal PERR produced by phase detector logic 62 to signal indicative of whether a frequency error is present. The signal produced by adder 70 is received and maintained by D-type flipflop 72. The frequency error signal produced by flipflop 72 is then passed through conditioning logic 74. Conditioning logic 74 operates as follows. If the absolute value of the magnitude of the frequency error signal produced by flipflop 72 is greater than a preset number such as 3, then the value of the signal produced by conditioning logic 74 is zero; otherwise, the signal produced by conditioning logic 74 corresponds to the frequency error signal produced by flipflop 72. This signal is then provided to flipflop 76, which produces signal FERR. For the illustration of FIG. 4, each flipflop 66, 68, 72 and 76 shown in FIG. 4 is a bank of five flipflops.

FIG. 4 is a detailed block diagram of frequency discriminator 42. As described above the inputs to frequency discriminator 42 of FIG. 4 are data signals ISOFT and QSOFT which are also shown in FIG. 2. Data signals ISOFT and QSOFT are, as illustrated in FIG. 4, five-bit digital signals that represent the data coming out of demodulator 40 which may still have some carrier frequency error on them. Another input to frequency discriminator 42 is a signal called QGI (Q greater than I) which indicates whether or not the magnitude of QSOFT is greater than the magnitude of ISOFT. When the magnitude of QSOFT is greater than the magnitude of ISOFT, then QGI has a high logic level, for this embodiment. When the magnitude of ISOFT is greater than the magnitude of QSOFT, then QGI has a low logic level, for this embodiment. Signal PPOL is also an input to frequency discriminator 42 of FIG. 4. Signal PPOL is used to invert the polarity of the output signal FERR for convenience, for compatibility with other devices that might use the output from discriminator 42. These inputs to discriminator 42 go into a phase detector logic 62 which estimates the phase error of the current data symbol. The equations for phase detector logic 62 are depicted in Table 1 above. Although a more detailed explanation of the equations inside phase detector logic 62 is given below, for the following example assume that the output PERR of phase detector logic 62 is a signal which is proportional to the carrier phase error for a particular data symbol. That phase error signal PERR then goes through a data register 66 and then goes through a second data register 68 and a bypass channel 64. The phase error that goes through the second register 68 is therefore delayed by one data symbol time from the phase error that bypassed the second register. The delayed phase error produced by register 68 is inverted by inverter 78 and is then subtracted from the non-delayed (bypassed) phase error. In effect, the combination of register 68 and adder 70 computes the difference between the current phase estimate and the phase estimate from the previous data symbol. This phase difference is used as an estimate for the derivative, a rate of change of the phase error, which is essentially the carrier frequency error. The resulting difference or difference function, or frequency error estimate, produced by adder 70 then is passed through another register 72 and finally goes through conditioning logic 74. Conditioning logic 74 distinguishes between a carrier phase difference that is due to data modulation, versus a carrier phase difference that is due to a carrier frequency error. Large phase differences are here presumed to be due to phase shifts of 90, 180, or 270 degrees from QPSK data modulation, or 180 degrees from BPSK modulation. Small phase shifts are here presumed to be due to carrier frequency error. Conditioning logic 74 includes a threshold which ignores very large frequency differences by producing an output of zero for those cases. On the other hand, if the carrier phase difference is below the preset threshold, then this information is assumed to be correct and it is passed on as an output from the frequency discriminator 42. The conditioning logic equation is that if the absolute value of the magnitude of the frequency error is greater than the threshold, then the frequency error equals 0, otherwise the frequency error produced by conditioning logic 74 will correspond to the frequency error produced by register 72. In words, for conditioning logic 74, if |in |>threshold (e.g. 3then out=0, else out=in. Although the block shown in FIG. 4 shows a fixed threshold of 3 as one example, the value of this threshold can be variable and can be selected depending on the expected range of carrier frequency errors and the type of modulation for a particular application. In other words, the threshold is a preset value which can be determined by the user.

Figure 5:
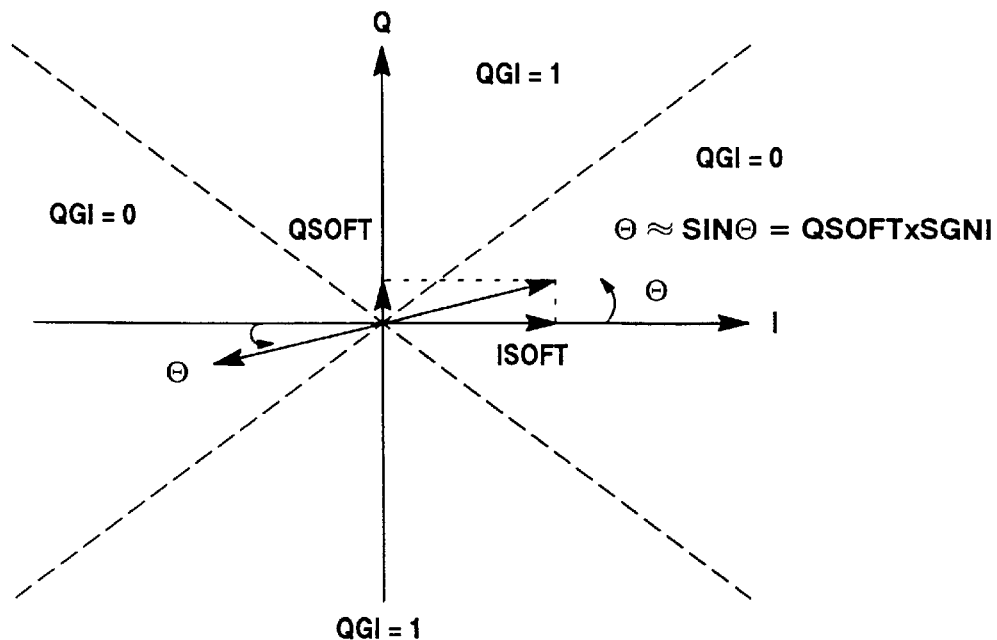
FIG. 5 is a carrier phase error diagram illustrating the situation when the received signal is close to the I axis.
Figure 6:
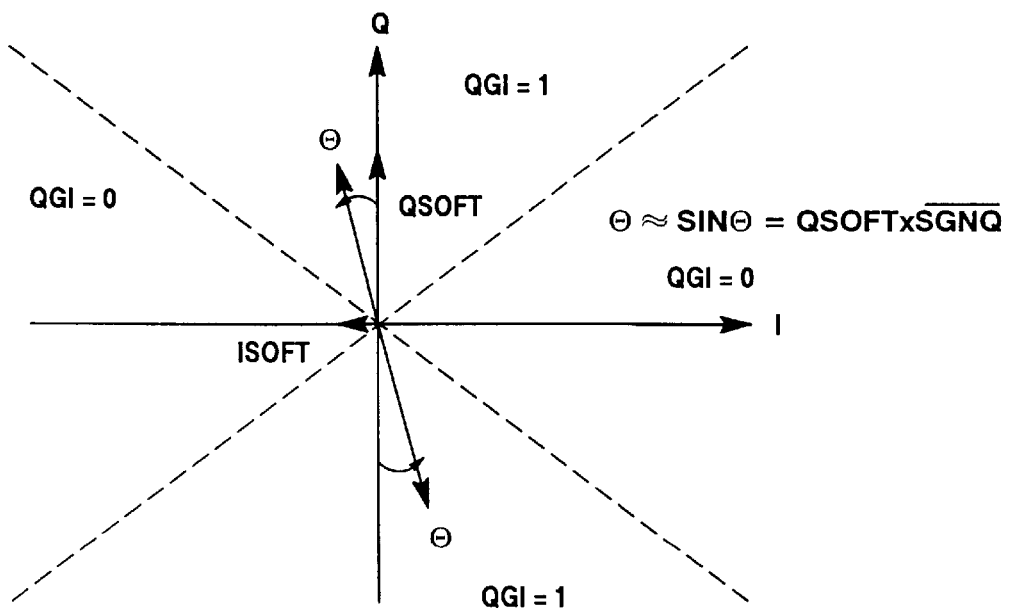
FIG. 6 is a carrier phase error diagram illustrating the situation when the received signal is close to the Q axis.

The expressions of Table 1 above, showing operation of phase detector logic 62, will now be further described by referring to FIGS. 5 and 6. The phase error shown in FIG. 5 and in FIG. 6 is measured relative to either the I axis or the Q axis, so that there are four regions on the plane shown in FIG. 5 and the plane shown in FIG. 6. To simplify the logic, a small angle approximation is used that approximates angle φ by sine φ. Sine φ is the same as either ±ISOFT or ±QSOFT, as depicted in FIGS. 5 and 6. In order to obtain the correct polarity of the error signal, it is also necessary to multiply QSOFT by the sign of ISOFT (Sgn I), or to multiply ISOFT by the converse or negative of the sign of QSOFT (−Sgn Q). As an example, suppose that the received signal R is closest to the I axis. For that situation, the projection of that signal onto the Q axis is considered to be the magnitude of the phase error, as shown in FIG. 5. On the other hand, if the received signal is closest to the Q axis, then the magnitude of the phase error is the projection of that signal onto the I axis as shown in FIG. 6.

As discussed above, frequency discriminator 42 can operate at a rate of one sample per data symbol. In discriminator 42, the phase error estimates are computed at the data symbol rate. Mathematically, this operation can be described as follows:

$$\left.\frac{d(\phi(t))}{dt}\right|_{t=kT} \approx \frac{\left(\hat{\phi}((k+1)T) - \hat{\phi}(kT)\right)}{T} \quad (2)$$

Where

φ (t) is the carrier phase,

φ̂ (kT) is the estimated carrier phase at time t=kT, and

φ̂ ((k+1)T) is the estimated carrier phase at time t=(k+1)T.

There are several differences between the method of expression (2) and that of expression (1) described above. First, the effective sampling rate of the carrier phase error has been reduced from 2/T to 1/T using expression (2). This has the effect of reducing the frequency acquisition range. Secondly, the data modulation is independent from data symbol to data symbol. Therefore, it can be difficult to distinguish between a phase difference that is due to data modulation, or a phase difference that is due to carrier frequency. To solve this problem, a threshold was used that essentially causes the detector to ignore larger phase differences that are presumed to be due to data modulation, i.e. phase shifts of 90 degrees, 180 degrees, or 270 degrees for QPSK, or 180 degrees for BPSK. This threshold feature reduces the frequency acquisition range of the loop. It also has the effect of reducing loop gain, since some error information is ignored, but it allows operation at a maximum rate of 1 sample per symbol.

Some of the many advantages of the invention should now be readily apparent. For example, apparatus and method have now been provided for carrier frequency recovery for a digital demodulator or for digital demodulation. Also, digital implementation of carrier frequency recovery has been provided, which implementation needs only one sample per data symbol. A low cost digital frequency discriminator and method have been provided that support higher data rates than would be provided by expression (1). Carrier frequency discrimination is provided by the present frequency discriminator. In addition, carrier frequency discrimination is provided that is compatible with DSK modulation methods such as BPSK or QPSK. In combination with the rest of the system of FIG. 2, or in combination with the digital loop filter of U.S. Pat. No. 5,060,180, carrier frequency acquisition and tracking are provided.

Obviously, many modifications and variations of the present invention are possible in light of the above teachings. It is therefore to be understood that the foregoing embodiment is presented by way of example only and that, within the scope of the appended claims and equivalents thereto, the invention may be practiced otherwise than as specifically described.

What is claimed is:

1. A method for reducing carrier frequency error in a received signal, comprising the steps of:
   converting a received signal to first and second digitized signals in quadrature relationship;
   comparing the sign of the first and second digitized signals and producing a phase error signal indicative thereof;
   adding the ones complement of a delayed version of the phase error signal to the phase error signal to produce a frequency error signal; and
   if the frequency error signal is below a predetermined threshold, then generating a correction signal.

2. A method as defined in claim 1 wherein said step of generating a correction signal comprises determining whether the frequency error signal indicates a frequency error less than or equal to the predetermined threshold, and if so producing the frequency error signal as the correction signal, otherwise producing a predetermined signal.

3. A method as defined in claim 1 wherein said adding step comprises the steps of:
   responsive to the phase error signal, producing a delayed phase error signal delayed by a predetermined amount; and
   responsive to the phase error signal and the delayed phase error signal, subtracting the phase error signal from the delayed phase error signal to produce the frequency error signal.

4. Apparatus for reducing carrier frequency error in a received signal, comprising:
   means for converting a received signal to first and second digitized signals in quadrature relationship;
   means for comparing the sign of the first and second digitized signals and producing a phase error signal indicative thereof;
   means for adding the ones complement of a delayed version of the phase error signal to the phase error signal to produce a frequency error signal; and
   means for generating a correction signal if the frequency error signal is below a predetermined threshold.

5. Apparatus as defined in claim 4 wherein said means for generating a correction signal comprises means for determining whether the frequency error signal indicates a frequency error less than or equal to the predetermined threshold, and if so, for producing the frequency error signal as the correction signal, otherwise producing a predetermined signal.

6. Apparatus as defined in claim 4 wherein said means for adding comprises:
   delay means receiving the phase error signal for producing a delayed phase error signal delayed by a predetermined amount; and
   subtracting means, receiving the phase error signal and the delayed phase error signal, for subtracting the phase error signal from the delayed phase error signal to produce the frequency error signal.

7. A frequency discriminator, comprising:
   phase detector means, responsive to first and second digital data signals and to a magnitude signal indicative of whether the magnitude of the first digital data signal is greater than the magnitude of the second digital data signal, for estimating phase error of the first and second digital data signals, and for producing a phase error signal indicative thereof;
   first determining means, receiving the phase error signal, for determining the difference between the current phase error estimate and a previous phase error estimate, and for producing a frequency error signal indicative thereof; and
   second determining means, responsive to the frequency error signal, for determining whether the frequency error signal indicates a frequency error sufficiently small to indicate presence of a carrier frequency error in the first and second digital data signals.

8. A frequency discriminator as defined in claim 7 wherein said first determining means comprises:
   delay means receiving the phase error signal for producing a delayed phase error signal delayed by a predetermined amount; and
   subtracting means, receiving the phase error signal and the delayed phase error signal, for subtracting the phase error signal from the delayed phase error signal to produce the frequency error signal.

9. A frequency discriminator as defined in claim 8 wherein said second determining means comprises means for determining whether the frequency error signal indicates a frequency error less than or equal to a predetermined threshold, and if so for producing the frequency error signal, otherwise producing a predetermined signal.

10. A frequency discriminator as defined in claim 7 wherein said second determining means comprises means for determining whether the frequency error signal indicates a frequency error less than or equal to a predetermined threshold, and if so for producing the frequency error signal, otherwise producing a predetermined signal.

11. A frequency discrimination method, comprising the steps of:
   responsive to first and second digital data signals and to a magnitude signal indicative of whether the magnitude of the first digital data signal is greater than the magnitude of the second digital data signal, estimating phase error of the first and second digital data signals, and producing a phase error signal indicative thereof;
   responsive to the phase error signal, determining the difference between the current phase error estimate and a previous phase error estimate, and producing a frequency error signal indicative thereof; and
   responsive to the frequency error signal, determining whether the frequency error signal indicates a frequency error sufficiently small to indicate presence of a carrier frequency error in the first and second digital data signals.

12. A frequency discrimination method as defined in claim 11 wherein said step of determining the difference comprises the steps of:
   responsive to the phase error signal, producing a delayed phase error signal delayed by a predetermined amount; and
   responsive to the phase error signal and the delayed phase error signal, subtracting the phase error signal from the delayed phase error signal to produce the frequency error signal.

13. A frequency discrimination method as defined in claim 12 wherein said step of determining whether the frequency error signal indicates a frequency error sufficiently small comprises determining whether the frequency error signal indicates a frequency error less than or equal to a predetermined threshold, and if so producing the frequency error signal, otherwise producing a predetermined signal.

14. A frequency discrimination method as defined in claim 11 wherein said step of determining whether the frequency error signal indicates a frequency error sufficiently small comprises determining whether the frequency error signal indicates a frequency error less than or equal to a predetermined threshold, and if so producing the frequency error signal, otherwise producing a predetermined signal.

15. Apparatus for reducing carrier frequency error in a received signal, comprising:
   means for converting a received signal to first and second digital signals in quadrature relationship;
   means, responsive to the first and second digital signals, for producing a magnitude signal indicative of whether the magnitude of the first digital signal is greater than the magnitude of the second digital signal;
   phase detector means, responsive to the first and second digital signals and to the magnitude signal, for estimating phase error of the received signal, and for producing a phase error signal indicative thereof;
   first determining means, receiving the phase error signal, for determining the difference between the current phase error estimate and a previous phase error estimate, and for producing a frequency error signal indicative thereof; and
   second determining means, responsive to the frequency error signal, for determining whether the frequency error signal indicates a frequency error sufficiently small to indicate presence of a carrier frequency error in the received signal.

16. Apparatus as defined in claim 15 wherein said first determining means comprises:
   delay means receiving the phase error signal for producing a delayed phase error signal delayed by a predetermined amount; and
   subtracting means, receiving the phase error signal and the delayed phase error signal, for subtracting the phase error signal from the delayed phase error signal to produce the frequency error signal.

17. Apparatus as defined in claim 16 wherein said second determining means comprises means for determining whether the frequency error signal indicates a frequency error less than or equal to a predetermined threshold, and if so for producing the frequency error signal, otherwise producing a predetermined signal.

18. Apparatus as defined in claim 15 wherein said second determining means comprises means for determining whether the frequency error signal indicates a frequency error less than or equal to a predetermined threshold, and if so for producing the frequency error signal, otherwise producing a predetermined signal.

19. A method for reducing carrier frequency error in a received signal, comprising the steps of:
   converting a received signal to first and second digital signals in quadrature relationship;
   responsive to the first and second digital signals, producing a magnitude signal indicative of whether the magnitude of the first digital signal is greater than the magnitude of the second digital signal;
   responsive to the first and second digital signals and to the magnitude signal, estimating phase error of the first and second digital signals, and producing a phase error signal indicative thereof;
   responsive to the phase error signal, determining the difference between the current phase error estimate and a previous phase error estimate, and producing a frequency error signal indicative thereof; and
   responsive to the frequency error signal, determining whether the frequency error signal indicates a frequency error sufficiently small to indicate presence of a carrier frequency error in the received signal.

20. A method as defined in claim 19 wherein said step of determining the difference comprises the steps of:
   responsive to the phase error signal, producing a delayed phase error signal delayed by a predetermined amount; and responsive to the phase error signal and the delayed phase error signal, subtracting the phase error signal from the delayed phase error signal to produce the frequency error signal.

21. A method as defined in claim 20 wherein said step of determining whether the frequency error signal indicates a frequency error sufficiently small comprises determining whether the frequency error signal indicates a frequency error less than or equal to a predetermined threshold, and if so producing the frequency error signal, otherwise producing a predetermined signal.

22. A method as defined in claim 19 wherein said step of determining whether the frequency error signal indicates a frequency error sufficiently small comprises determining whether the frequency error signal indicates a frequency error less than or equal to a predetermined threshold, and if so producing the frequency error signal, otherwise producing a predetermined signal.

23. A frequency discriminator, comprising:

signal processing means, receiving first, second, third and fourth signals, for producing a fifth signal according to the following table:

| First Signal | Second Signal | Fifth Signal |
|---|---|---|
| 0 | 0 | sgn (third signal) ⊕ fourth signal |
| 0 | 1 | sgn (fourth signal) ⊕ third signal |
| 1 | 0 | sgn (third signal) ⊕ fourth signal |
| 1 | 1 | sgn (fourth signal) ⊕ third signal | delay means receiving the fifth signal for producing a delayed fifth signal;

one's complement inversion means, receiving the delayed fifth signal, for producing the one's complement inversion of the delayed fifth signal;

an adder, receiving the fifth signal and the one's complement inversion of the fifth signal, for producing a sixth signal indicative of whether a frequency error is present; and comparing means, receiving the sixth signal, for comparing the sixth signal with a predetermined threshold and producing a seventh signal that is at a predetermined level if the sixth signal exceeds the predetermined threshold, the seventh signal corresponding to the sixth signal if the sixth signal does not exceed the predetermined threshold.

24. A frequency discrimination method, comprising the steps of:

responsive to first, second, third and fourth signals, producing a fifth signal according to the following table:

| First Signal | Second Signal | Fifth Signal |
|---|---|---|
| 0 | 0 | sgn (third signal) ⊕ fourth signal |
| 0 | 1 | sgn (fourth signal) ⊕ third signal |
| 1 | 0 | sgn (third signal) ⊕ fourth signal |
| 1 | 1 | sgn (fourth signal) ⊕ third signal | responsive to the fifth signal, producing a delayed fifth signal;

responsive to the delayed fifth signal producing the one's complement inversion of the delayed fifth signal;

responsive to the fifth signal and the one's complement inversion of the fifth signal, producing a sixth signal indicative of whether a frequency error is present; and responsive to the sixth signal, comparing the sixth signal with a predetermined threshold and producing a seventh signal that is at a predetermined level if the sixth signal exceeds the predetermined threshold, the seventh signal corresponding to the sixth signal if the sixth signal does not exceed the predetermined threshold.

25. A method as defined in claim 1 wherein said comparing step comprises the steps of:

responsive to the first and second digitized signals, producing a magnitude signal indicative of whether the magnitude of the first digitized signal is greater than the magnitude of the second digitized signal; and responsive to the first and second digitized signals, the magnitude signal, and a third signal, producing the phase error signal according to the following table:

| Third Signal | Magnitude Signal | Phase Error Signal |
|---|---|---|
| 0 | 0 | sgn (first signal) ⊕ second signal |
| 0 | 1 | sgn (second signal) ⊕ first signal |
| 1 | 0 | sgn (first signal) ⊕ second signal |
| 1 | 1 | sgn (second signal) ⊕ first signal |

26. Apparatus as defined in claim 4 wherein said means for comparing comprises:

means, responsive to the first and second digitized signals, for producing a magnitude signal indicative of whether the magnitude of the first digitized signal is greater than the magnitude of the second digitized signal; and means, responsive to the first and second digitized signals, the magnitude signal, and a third signal, for producing the phase error signal according to the following table:

| Third Signal | Magnitude Signal | Phase Error Signal |
|---|---|---|
| 0 | 0 | sgn (first signal) ⊕ second signal |
| 0 | 1 | sgn (second signal) ⊕ first signal |
| 1 | 0 | sgn (first signal) ⊕ second signal |
| 1 | 1 | sgn (second signal) ⊕ first signal. |

27. A frequency discriminator as defined in claim 7 wherein said phase detector means comprises:

means, responsive to the first and second digital data signals, the magnitude signal, and a third signal, for producing the phase error signal according to the following table:

| Third Signal | Magnitude Signal | Phase Error Signal |
|---|---|---|
| 0 | 0 | sgn (first signal) ⊕ second signal |
| 0 | 1 | sgn (second signal) ⊕ first signal |
| 1 | 0 | sgn (first signal) ⊕ second signal |
| 1 | 1 | sgn (second signal) ⊕ first signal. |

28. A frequency discrimination method as defined in claim 11 wherein said step of estimating phase error comprises the step of:

responsive to the first and second digital data signals, the magnitude signal, and a third signal, producing the phase error signal according to the following table:

| Third Signal | Magnitude Signal | Phase Error Signal |
|---|---|---|
| 0 | 0 | sgn (first signal) ⊕ second signal |
| 0 | 1 | sgn (second signal) ⊕ first signal |
| 1 | 0 | sgn (first signal) ⊕ second signal |
| 1 | 1 | sgn (second signal) ⊕ first signal. |

29. Apparatus as defined in claim 15 wherein said phase detector means comprises:
 means, responsive to the first and second digital signals, the magnitude signal, and a third signal, for producing the phase error signal according to the following table:

| Third Signal | Magnitude Signal | Phase Error Signal |
|---|---|---|
| 0 | 0 | sgn (first signal) ⊕ second signal |
| 0 | 1 | sgn (second signal) ⊕ first signal |
| 1 | 0 | sgn (first signal) ⊕ second signal |
| 1 | 1 | sgn (second signal) ⊕ first signal. |

30. A method as defined in claim 19 wherein said step of estimating phase error comprises the step of:
 responsive to the first and second digital signals, the magnitude signal, and a third signal, producing the phase error signal according to the following table:

| Third Signal | Magnitude Signal | Phase Error Signal |
|---|---|---|
| 0 | 0 | sgn (first signal) ⊕ second signal |
| 0 | 1 | sgn (second signal) ⊕ first signal |
| 1 | 0 | sgn (first signal) ⊕ second signal |
| 1 | 1 | sgn (second signal) ⊕ first signal. |

31. A method as defined in claim 2 wherein said comparing step comprises the steps of:
 responsive to the first and second digitized signals, producing a magnitude signal indicative of whether the magnitude of the first digitized signal is greater than the magnitude of the second digitized signal; and
 responsive to the first and second digitized signals and the magnitude signal, producing as the phase error signal a signal representative of the product of the second digitized signal multiplied by the inverse of the sign of the first digitized signal if the magnitude of the first digitized signal is greater than the magnitude of the second digitized signal, otherwise producing, as the phase error signal, a signal representative of the product of the first digitized signal multiplied by the sign of the second digitized signal.

32. A method as defined in claim 3 wherein said comparing step comprises the steps of:
 responsive to the first and second digitized signals, producing a magnitude signal indicative of whether the magnitude of the first digitized signal is greater than the magnitude of the second digitized signal; and
 responsive to the first and second digitized signals and the magnitude signal, producing as the phase error signal a signal representative of the product of the second digitized signal multiplied by the inverse of the sign of the first digitized signal if the magnitude of the first digitized signal is greater than the magnitude of the second digitized signal, otherwise producing, as the phase error signal, a signal representative of the product of the first digitized signal multiplied by the sign of the second digitized signal.

33. A method as defined in claim 1 wherein said comparing step comprises the steps of:
 responsive to the first and second digitized signals, producing a magnitude signal indicative of whether the magnitude of the first digitized signal is greater than the magnitude of the second digitized signal; and
 responsive to the first and second digitized signals and the magnitude signal, producing as the phase error signal a signal representative of the product of the second digitized signal multiplied by the inverse of the sign of the first digitized signal if the magnitude of the first digitized signal is greater than the magnitude of the second digitized signal, otherwise producing, as the phase error signal, a signal representative of the product of the first digitized signal multiplied by the sign of the second digitized signal.

34. Apparatus as defined in claim 5 wherein said means for comparing comprises:
 means, receiving the first and second digitized signals, for producing a magnitude signal indicative of whether the magnitude of the first digitized signal is greater than the magnitude of the second digitized signal; and means, receiving the first and second digitized signals and the magnitude signal, for producing as the phase error signal a signal representative of the product of the second digitized signal multiplied by the inverse of the sign of the first digitized signal if the magnitude of the first digitized signal is greater than the magnitude of the second digitized signal, otherwise producing, as the phase error signal, a signal representative of the product of the first digitized signal multiplied by the sign of the second digitized signal.

35. Apparatus as defined in claim 6 wherein said means for comparing comprises:
 means, receiving the first and second digitized signals, for producing a magnitude signal indicative of whether the magnitude of the first digitized signal is greater than the magnitude of the second digitized signal; and
 means, receiving the first and second digitized signals and the magnitude signal, for producing as the phase error signal a signal representative of the product of the second digitized signal multiplied by the inverse of the sign of the first digitized signal if the magnitude of the first digitized signal is greater than the magnitude of the second digitized signal, otherwise producing, as the phase error signal, a signal representative of the product of the first digitized signal multiplied by the sign of the second digitized signal.

36. Apparatus as defined in claim 4 wherein said means for comparing comprises:
 means, receiving the first and second digitized signals, for producing a magnitude signal indicative of whether the magnitude of the first digitized signal is greater than the magnitude of the second digitized signal; and
 means, receiving the first and second digitized signals and the magnitude signal, for producing as the phase error signal a signal representative of the product of the second digitized signal multiplied by the inverse of the sign of the first digitized signal if the magnitude of the first digitized signal is greater than the magnitude of the second digitized signal, otherwise producing, as the phase error signal, a signal representative of the product of the first digitized signal multiplied by the sign of the second digitized signal.

37. A frequency discriminator as defined in claim 8 wherein said phase detector means comprises:

means, receiving the first and second digital data signals and the magnitude signal, for producing as the phase error signal a signal representative of the product of the second digital data signal multiplied by the inverse of the sign of the first digital data signal if the magnitude of the first digital data signal is greater than the magnitude of the second digital data signal, otherwise producing, as the phase error signal, a signal representative of the product of the first digital data signal multiplied by the sign of the second digital data signal.

38. A frequency discriminator as defined in claim 9 wherein said phase detector means comprises:

means, receiving the first and second digital data signals and the magnitude signal, for producing as the phase error signal a signal representative of the product of the second digital data signal multiplied by the inverse of the sign of the first digital data signal if the magnitude of the first digital data signal is greater than the magnitude of the second digital data signal, otherwise producing, as the phase error signal, a signal representative of the product of the first digital data signal multiplied by the sign of the second digital data signal.

39. A frequency discriminator as defined in claim 10 wherein said phase detector means comprises:

means, receiving the first and second digital data signals and the magnitude signal, for producing as the phase error signal a signal representative of the product of the second digital data signal multiplied by the inverse of the sign of the first digital data signal if the magnitude of the first digital data signal is greater than the magnitude of the second digital data signal, otherwise producing, as the phase error signal, a signal representative of the product of the first digital data signal multiplied by the sign of the second digital data signal.

40. A frequency discriminator as defined in claim 7 wherein said phase detector means comprises:

means, receiving the first and second digital data signals and the magnitude signal, for producing as the phase error signal a signal representative of the product of the second digital data signal multiplied by the inverse of the sign of the first digital data signal if the magnitude of the first digital data signal is greater than the magnitude of the second digital data signal, otherwise producing, as the phase error signal, a signal representative of the product of the first digital data signal multiplied by the sign of the second digital data signal.

41. A frequency discrimination method as defined in claim 12 wherein said step of estimating phase error comprises the step of:

responsive to the first and second digital data signals and the magnitude signal, producing as the phase error signal a signal representative of the product of the second digital data signal multiplied by the inverse of the sign of the first digital data signal if the magnitude of the first digital data signal is greater than the magnitude of the second digital data signal, otherwise producing, as the phase error signal, a signal representative of the product of the first digital data signal multiplied by the sign of the second digital data signal.

42. A frequency discrimination method as defined in claim 13 wherein said step of estimating phase error comprises the step of:

responsive to the first and second digital data signals and the magnitude signal, producing as the phase error signal a signal representative of the product of the second digital data signal multiplied by the inverse of the sign of the first digital data signal if the magnitude of the first digital data signal is greater than the magnitude of the second digital data signal, otherwise producing, as the phase error signal, a signal representative of the product of the first digital data signal multiplied by the sign of the second digital data signal.

43. A frequency discrimination method as defined in claim 14 wherein said step of estimating phase error comprises the step of:

responsive to the first and second digital data signals and the magnitude signal, producing as the phase error signal a signal representative of the product of the second digital data signal multiplied by the inverse of the sign of the first digital data signal if the magnitude of the first digital data signal is greater than the magnitude of the second digital data signal, otherwise producing, as the phase error signal, a signal representative of the product of the first digital data signal multiplied by the sign of the second digital data signal.

44. A frequency discrimination method as defined in claim 11 wherein said step of estimating phase error comprises the step of:

responsive to the first and second digital data signals and the magnitude signal, producing as the phase error signal a signal representative of the product of the second digital data signal multiplied by the inverse of the sign of the first digital data signal if the magnitude of the first digital data signal is greater than the magnitude of the second digital data signal, otherwise producing, as the phase error signal, a signal representative of the product of the first digital data signal multiplied by the sign of the second digital data signal.

45. Apparatus as defined in claim 16 wherein said phase detector means comprises:

means, receiving the first and second digital signals and the magnitude signal, for producing as the phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal.

46. Apparatus as defined in claim 17 wherein said phase detector means comprises:

means, receiving the first and second digital signals and the magnitude signal, for producing as the phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal.

47. Apparatus as defined in claim 18 wherein said phase detector means comprises:

means, receiving the first and second digital signals and the magnitude signal, for producing as the phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal.

48. Apparatus as defined in claim 15 wherein said phase detector means comprises:

means, receiving the first and second digital signals and the magnitude signal, for producing as the phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal.

49. A method as defined in claim 20 wherein said step of estimating phase error comprises the step of:

responsive to the first and second digital signals and the magnitude signal, producing as the phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal.

50. A method as defined in claim 21 wherein said step of estimating phase error comprises the step of:

responsive to the first and second digital signals and the magnitude signal, producing as the phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal.

51. A method as defined in claim 22 wherein said step of estimating phase error comprises the step of:

responsive to the first and second digital signals and the magnitude signal, producing as the phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal.

52. A method as defined in claim 19 wherein said step of estimating phase error comprises the step of:

responsive to the first and second digital signals and the magnitude signal, producing as the phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal.

53. A frequency discriminator, comprising:

means, receiving first and second digital signals, for producing a magnitude signal indicative of whether the magnitude of the first digital signal is greater than the magnitude of the second digital signal;

signal processing means, receiving the first and second digital signals and the magnitude signal, for producing as a phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal;

delay means, receiving the phase error signal, for producing a delayed phase error signal;

one's complement inversion means, receiving the delayed phase error signal, for producing the one's complement inversion of the delayed phase error signal;

an adder, receiving the phase error signal and the one's complement inversion of the phase error signal, for producing a frequency error signal indicative of whether a frequency error is present; and comparing means, receiving the frequency error signal, for comparing the frequency error signal with a predetermined threshold and producing a third signal that is at a predetermined level if the frequency error signal exceeds the predetermined threshold, the third signal corresponding to the frequency error signal if the frequency error signal does not exceed the predetermined threshold.

54. A frequency discrimination method, comprising the steps of:

responsive to first and second digital signals, producing a magnitude signal indicative of whether the magnitude of the first digital signal is greater than the magnitude of the second digital signal;

responsive to the first and second digital signals and the magnitude signal, producing as a phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal;

responsive to the phase error signal, producing a delayed phase error signal;

responsive to the delayed phase error signal, producing the one's complement inversion of the delayed phase error signal;

responsive to the phase error signal and the one's complement inversion of the phase error signal, producing a frequency error signal indicative of whether a frequency error is present; and responsive to the frequency error signal, comparing the frequency error signal with a predetermined threshold and producing a third signal that is at a predetermined level if the frequency error signal exceeds the predetermined threshold, the third signal corresponding to the frequency error signal if the frequency error signal does not exceed the predetermined threshold.

55. A frequency discriminator, comprising:

phase detector means, receiving first and second digital data signals and a magnitude signal indicative of whether the magnitude of the first digital data signal is greater than the magnitude of the second digital data signal, for producing as a phase error signal a signal representative of the product of the second digital data signal multiplied by the inverse of the sign of the first digital data signal if the magnitude of the first digital data signal is greater than the magnitude of the second digital data signal, otherwise producing, as the phase error signal, a signal representative of the product of the first digital data signal multiplied by the sign of the second digital data signal; and first determining means, receiving the phase error signal, for determining the difference between the current value of the phase error signal and a previous value of the phase error signal, and for producing a frequency error signal indicative thereof.

56. A frequency discriminator as defined in claim 55 wherein said first determining means comprises:

delay means receiving the phase error signal for producing a delayed phase error signal delayed by a predetermined amount; and subtracting means, receiving the phase error signal and the delayed phase error signal, for subtracting the phase error signal from the delayed phase error signal to produce the frequency error signal.

57. A frequency discriminator as defined in claim 56, further comprising second determining means, receiving the frequency error signal, for determining whether the frequency error signal indicates a frequency error less than or equal to a predetermined threshold, and if so for producing the frequency error signal, otherwise producing a predetermined signal.

58. A frequency discriminator as defined in claim 55, further comprising second determining means, receiving the frequency error signal, for determining whether the frequency error signal indicates a frequency error less than or equal to a predetermined threshold, and if so for producing the frequency error signal, otherwise producing a predetermined signal.

59. A frequency discrimination method, comprising the steps of:

responsive to first and second digital data signals and to a magnitude signal indicative of whether the magnitude of the first digital data signal is greater than the magnitude of the second digital data signal, producing as a phase error signal a signal representative of the product of the second digital data signal multiplied by the inverse of the sign of the first digital data signal if the magnitude of the first digital data signal is greater than the magnitude of the second digital data signal, otherwise producing, as the phase error signal, a signal representative of the product of the first digital data signal multiplied by the sign of the second digital data signal; and responsive to the phase error signal, determining the difference between the current value of the phase error signal and a previous value of the phase error signal, and producing a frequency error signal indicative thereof.

60. A frequency discrimination method as defined in claim 59 wherein said step of determining the difference comprises the steps of:

responsive to the phase error signal, producing a delayed phase error signal delayed by a predetermined amount; and responsive to the phase error signal and the delayed phase error signal, subtracting the phase error signal from the delayed phase error signal to produce the frequency error signal.

61. A frequency discrimination method as defined in claim 60, further comprising the step of determining whether the frequency error signal indicates a frequency error less than or equal to a predetermined threshold, and if so producing the frequency error signal, otherwise producing a predetermined signal.

62. A frequency discrimination method as defined in claim 59, further comprising the step of determining whether the frequency error signal indicates a frequency error less than or equal to a predetermined threshold, and if so producing the frequency error signal, otherwise producing a predetermined signal.

63. Apparatus for determining a phase error in a received signal, comprising:

means for converting a received signal to first and second digital signals in quadrature relationship;

means, responsive to the first and second digital signals, for producing a magnitude signal indicative of whether the magnitude of the first digital signal is greater than the magnitude of the second digital signal; and phase detector means, receiving the first and second digital signals and the magnitude signal, for producing as a phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal.

64. Apparatus as defined in claim 63, further comprising:

first determining means, receiving the phase error signal, for determining the difference between the current value of the phase error signal and a previous value of the phase error signal, and for producing a frequency error signal indicative thereof.

65. Apparatus as defined in claim 64, further comprising second determining means, receiving the frequency error signal, for determining whether the frequency error signal indicates a frequency error less than or equal to a predetermined threshold, and if so for producing the frequency error signal, otherwise producing a predetermined signal.

66. Apparatus as defined in claim 63, further comprising:

delay means receiving the phase error signal for producing a delayed phase error signal delayed by a predetermined amount; and subtracting means, receiving the phase error signal and the delayed phase error signal, for subtracting the phase error signal from the delayed phase error signal to produce a frequency error signal.

67. Apparatus as defined in claim 66, further comprising determining means, receiving the frequency error signal, for determining whether the frequency error signal indicates a frequency error less than or equal to a predetermined threshold, and if so for producing the frequency error signal, otherwise producing a predetermined signal.

68. A method for determining a phase error in a received signal, comprising the steps of:

converting a received signal to first and second digital signals in quadrature relationship;

responsive to the first and second digital signals, producing a magnitude signal indicative of whether the magnitude of the first digital signal is greater than the magnitude of the second digital signal; and responsive to the first and second digital signals and the magnitude signal, producing as a phase error signal a signal representative of the product of the second digital signal multiplied by the inverse of the sign of the first digital signal if the magnitude of the first digital signal is greater than the magnitude of the second digital signal, otherwise producing, as the phase error signal, a signal representative of the product of the first digital signal multiplied by the sign of the second digital signal.

69. A method as defined in claim 68, further comprising the steps of:

responsive to the phase error signal, determining the difference between the current value of the phase error signal and a previous value of the phase error signal; and producing a frequency error signal indicative thereof.

70. A method as defined in claim 69, further comprising the step of:

determining whether the frequency error signal indicates a frequency error less than or equal to a predetermined threshold, and if so producing the frequency error signal, otherwise producing a predetermined signal.

71. A method as defined in claim 68, further comprising the steps of:

responsive to the phase error signal, producing a delayed phase error signal delayed by a predetermined amount; and responsive to the phase error signal and the delayed phase error signal, subtracting the phase error signal from the delayed phase error signal to produce a frequency error signal.

72. A method as defined in claim 71, further comprising the step of determining whether the frequency error signal indicates a frequency error less than or equal to a predetermined threshold, and if so producing the frequency error signal, otherwise producing a predetermined signal.

73. A method as defined in claim 2 wherein said comparing step comprises the steps of:

responsive to the first and second digitized signals, producing a magnitude signal indicative of whether the magnitude of the first digitized signal is greater than the magnitude of the second digitized signal; and responsive to the first and second digitized signals and the magnitude signal, producing as the phase error signal a signal representative of the second digitized signal exclusive-ORed with the inverse of the digital sign of the first digitized signal if the magnitude of the first digitized signal is greater than the magnitude of the second digitized signal, otherwise producing, as the phase error signal, a signal representative of the first digitized signal exclusive-ORed with the digital sign of the second digitized signal.

74. A method as defined in claim 3 wherein said comparing step comprises the steps of:

responsive to the first and second digitized signals, producing a magnitude signal indicative of whether the magnitude of the first digitized signal is greater than the magnitude of the second digitized signal; and responsive to the first and second digitized signals and the magnitude signal, producing as the phase error signal a signal representative of the second digitized signal exclusive-ORed with the inverse of the digital sign of the first digitized signal if the magnitude of the first digitized signal is greater than the magnitude of the second digitized signal, otherwise producing, as the phase error signal, a signal representative of the first digitized signal exclusive-ORed with the digital sign of the second digitized signal.

75. A method as defined in claim 1 wherein said comparing step comprises the steps of:

responsive to the first and second digitized signals, producing a magnitude signal indicative of whether the magnitude of the first digitized signal is greater than the magnitude of the second digitized signal; and responsive to the first and second digitized signals and the magnitude signal, producing as the phase error signal a signal representative of the second digitized signal exclusive-ORed with the inverse of the digital sign of the first digitized signal if the magnitude of the first digitized signal is greater than the magnitude of the second digitized signal, otherwise producing, as the phase error signal, a signal representative of the first digitized signal exclusive-ORed with the digital sign of the second digitized signal.

76. Apparatus as defined in claim 5 wherein said means for comparing comprises:

means, receiving the first and second digitized signals, for producing a magnitude signal indicative of whether the magnitude of the first digitized signal is greater than the magnitude of the second digitized signal; and means, receiving the first and second digitized signals and the magnitude signal, for producing as the phase error signal a signal representative of the second digitized signal exclusive-ORed with the inverse of the digital sign of the first digitized signal if the magnitude of the first digitized signal is greater than the magnitude of the second digitized signal, otherwise producing, as the phase error signal, a signal representative of the first digitized signal exclusive-ORed with the digital sign of the second digitized signal.

77. Apparatus as defined in claim 6 wherein said means for comparing comprises:

means, receiving the first and second digitized signals, for producing a magnitude signal indicative of whether the magnitude of the first digitized signal is greater than the magnitude of the second digitized signal; and means, receiving the first and second digitized signals and the magnitude signal, for producing as the phase error signal a signal representative of the second digitized signal exclusive-ORed with the inverse of the digital sign of the first digitized signal if the magnitude of the first digitized signal is greater than the magnitude of the second digitized signal, otherwise producing, as the phase error signal, a signal representative of the first digitized signal exclusive-ORed with the digital sign of the second digitized signal.

78. Apparatus as defined in claim 4 wherein said means for comparing comprises:

means, receiving the first and second digitized signals, for producing a magnitude signal indicative of whether the magnitude of the first digitized signal is greater than the magnitude of the second digitized signal; and means, receiving the first and second digitized signals and the magnitude signal, for producing as the phase error signal a signal representative of the second digitized signal exclusive-ORed with the inverse of the digital sign of the first digitized signal if the magnitude of the first digitized signal is greater than the magnitude of the second digitized signal, otherwise producing, as the phase error signal, a signal representative of the first digitized signal exclusive-ORed with the digital sign of the second digitized signal.

79. A frequency discriminator as defined in claim 8 wherein said phase detector means comprises:

means, receiving the first and second digital data signals and the magnitude signal, for producing as the phase error signal a signal representative of the second digital data signal exclusive-ORed with the inverse of the digital sign of the first digital data signal if the magnitude of the first digital data signal is greater than the magnitude of the second digital data signal, otherwise producing, as the phase error signal, a signal representative of the first digital data signal exclusive-ORed with the digital sign of the second digital data signal.

80. A frequency discriminator as defined in claim 9 wherein said phase detector means comprises:

means, receiving the first and second digital data signals and the magnitude signal, for producing as the phase error signal a signal representative of the second digital data signal exclusive-ORed with the inverse of the digital sign of the first digital data signal if the magnitude of the first digital data signal is greater than the magnitude of the second digital data signal, otherwise producing, as the phase error signal, a signal representative of the first digital data signal exclusive-ORed with the digital sign of the second digital data signal.

81. A frequency discriminator as defined in claim 10 wherein said phase detector means comprises:

means, receiving the first and second digital data signals and the magnitude signal, for producing as the phase error signal a signal representative of the second digital data signal exclusive-ORed with the inverse of the digital sign of the first digital data signal if the magnitude of the first digital data signal is greater than the magnitude of the second digital data signal, otherwise producing, as the phase error signal, a signal representative of the first digital data signal exclusive-ORed with the digital sign of the second digital data signal.

82. A frequency discriminator as defined in claim 7 wherein said phase detector means comprises:

means, receiving the first and second digital data signals and the magnitude signal, for producing as the phase error signal a signal representative of the second digital data signal exclusive-ORed with the inverse of the digital sign of the first digital data signal if the magnitude of the first digital data signal is greater than the magnitude of the second digital data signal, otherwise producing, as the phase error signal, a signal representative of the first digital data signal exclusive-ORed with the digital sign of the second digital data signal.

83. A frequency discrimination method as defined in claim 12 wherein said step of estimating phase error comprises the step of:

responsive to the first and second digital data signals and the magnitude signal, producing as the phase error signal a signal representative of the second digital data signal exclusive-ORed with the inverse of the digital sign of the first digital data signal if the magnitude of the first digital data signal is greater than the magnitude of the second digital data signal, otherwise producing, as the phase error signal, a signal representative of the first digital data signal exclusive-ORed with the digital sign of the second digital data signal.

84. A frequency discrimination method as defined in claim 13 wherein said step of estimating phase error comprises the step of:

responsive to the first and second digital data signals and the magnitude signal, producing as the phase error signal a signal representative of the second digital data signal exclusive-ORed with the inverse of the digital sign of the first digital data signal if the magnitude of the first digital data signal is greater than the magnitude of the second digital data signal, otherwise producing, as the phase error signal, a signal representative of the first digital data signal exclusive-ORed with the digital sign of the second digital data signal.

85. A frequency discrimination method as defined in claim 14 wherein said step of estimating phase error comprises the step of:

responsive to the first and second digital data signals and the magnitude signal, producing as the phase error signal a signal representative of the second digital data signal exclusive-ORed with the inverse of the digital sign of the first digital data signal if the magnitude of the first digital data signal is greater than the magnitude of the second digital data signal, otherwise producing, as the phase error signal, a signal representative of the first digital data signal exclusive-ORed with the digital sign of the second digital data signal.

86. A frequency discrimination method as defined in claim 11 wherein said step of estimating phase error comprises the step of:

responsive to the first and second digital data signals and the magnitude signal, producing as the phase error signal a signal representative of the second digital data signal exclusive-ORed with the inverse of the digital sign of the first digital data signal if the magnitude of the first digital data signal is greater than the magnitude of the second digital data signal, otherwise producing, as the phase error signal, a signal representative of the first digital data signal exclusive-ORed with the digital sign of the second digital data signal.

87. Apparatus as defined in claim 16 wherein said phase detector means comprises:

means, receiving the first and second digital signals and the magnitude signal, for producing as the phase error signal a signal representative of the second digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal.

88. Apparatus as defined in claim 17 wherein said phase detector means comprises:

means, receiving the first and second digital signals and the magnitude signal, for producing as the phase error signal a signal representative of the second digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal.

89. Apparatus as defined in claim 18 wherein said phase detector means comprises:

means, receiving the first and second digital signals and the magnitude signal, for producing as the phase error signal a signal representative of the second digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal.

90. Apparatus as defined in claim 15 wherein said phase detector means comprises:

means, receiving the first and second digital signals and the magnitude signal, for producing as the phase error signal a signal representative of the second digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal.

91. A method as defined in claim 20 wherein said step of estimating phase error comprises the step of:

responsive to the first and second digital signals and the magnitude signal, producing as the phase error signal a signal representative of the second digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal.

92. A method as defined in claim 21 wherein said step of estimating phase error comprises the step of:

responsive to the first and second digital signals and the magnitude signal, producing as the phase error signal a signal representative of the second digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal.

93. A method as defined in claim 22 wherein said step of estimating phase error comprises the step of:

responsive to the first and second digital signals and the magnitude signal, producing as the phase error signal a signal representative of the second digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal.

94. A method as defined in claim 19 wherein said step of estimating phase error comprises the step of:

responsive to the first and second digital signals and the magnitude signal, producing as the phase error signal a signal representative of the second digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal.

95. A frequency discriminator, comprising:

means, receiving first and second digital signals, for producing a magnitude signal indicative of whether the magnitude of the first digital signal is greater than the magnitude of the second digital signal;

signal processing means, receiving the first and second digital signals and the magnitude signal, for producing as a phase error signal a signal representative of the second digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal;

delay means, receiving the phase error signal, for producing a delayed phase error signal;

one's complement inversion means, receiving the delayed phase error signal, for producing the one's complement inversion of the delayed phase error signal;

an adder, receiving the phase error signal and the one's complement inversion of the phase error signal, for producing a frequency error signal indicative of whether a frequency error is present; and comparing means, receiving the frequency error signal, for comparing the frequency error signal with a predetermined threshold and producing a third signal that is at a predetermined level if the frequency error signal exceeds the predetermined threshold, the third signal corresponding to the frequency error signal if the frequency error signal does not exceed the predetermined threshold.

96. A frequency discrimination method, comprising the steps of:

responsive to first and second digital signals, producing a magnitude signal indicative of whether the magnitude of the first digital signal is greater than the magnitude of the second digital signal;

responsive to the first and second digital signals and the magnitude signal, producing as a phase error signal a signal representative of the second digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal;

responsive to the phase error signal, producing a delayed phase error signal;

responsive to the delayed phase error signal, producing the one's complement inversion of the delayed phase error signal;

responsive to the phase error signal and the one's complement inversion of the phase error signal, producing a frequency error signal indicative of whether a frequency error is present; and responsive to the frequency error signal, comparing the frequency error signal with a predetermined threshold and producing a third signal that is at a predetermined level if the frequency error signal exceeds the predetermined threshold, the third signal corresponding to the frequency error signal if the frequency error signal does not exceed the predetermined threshold.

97. A frequency discriminator, comprising:

phase detector means, receiving first and second digital data signals and a magnitude signal indicative of whether the magnitude of the first digital data signal is greater than the magnitude of the second digital data signal, for producing as a phase error signal a signal representative of the second digital data signal exclusive-ORed with the inverse of the digital sign of the first digital data signal if the magnitude of the first digital data signal is greater than the magnitude of the second digital data signal, otherwise producing, as the phase error signal, a signal representative of the first digital data signal exclusive-ORed with the digital sign of the second digital data signal; and first determining means, receiving the phase error signal, for determining the difference between the current value of the phase error signal and a previous value of the phase error signal, and for producing a frequency error signal indicative thereof.

98. A frequency discriminator as defined in claim 97 wherein said first determining means comprises:

delay means receiving the phase error signal for producing a delayed phase error signal delayed by a predetermined amount; and subtracting means, receiving the phase error signal and the delayed phase error signal, for subtracting the phase error signal from the delayed phase error signal to produce the frequency error signal.

99. A frequency discriminator as defined in claim 98, further comprising second determining means, receiving the frequency error signal, for determining whether the frequency error signal indicates a frequency error less than or equal to a predetermined threshold, and if so, for producing the frequency error signal, otherwise producing a predetermined signal.

100. A frequency discriminator as defined in claim 97, further comprising second determining means, receiving the frequency error signal, for determining whether the frequency error signal indicates a frequency error less than or equal to a predetermined threshold, and if so, for producing the frequency error signal, otherwise producing a predetermined signal.

101. A frequency discrimination method, comprising the steps of:

responsive to first and second digital data signals and to a magnitude signal indicative of whether the magnitude of the first digital data signal is greater than the magnitude of the second digital data signal, producing as a phase error signal a signal representative of the second digital data signal exclusive-ORed with the inverse of the digital sign of the first digital data signal if the magnitude of the first digital data signal is greater than the magnitude of the second digital data signal, otherwise producing, as the phase error signal, a signal representative of the first digital data signal exclusive-ORed with the digital sign of the second digital data signal; and responsive to the phase error signal, determining the difference between the current value of the phase error signal and a previous value of the phase error signal, and producing a frequency error signal indicative thereof.

102. A frequency discrimination method as defined in claim 101 wherein said step of determining the difference comprises the steps of:

responsive to the phase error signal, producing a delayed phase error signal delayed by a predetermined amount; and responsive to the phase error signal and the delayed phase error signal, subtracting the phase error signal from the delayed phase error signal to produce the frequency error signal.

103. A frequency discrimination method as defined in claim 102, further comprising the step of determining whether the frequency error signal indicates a frequency error less than or equal to a predetermined threshold, and if so producing the frequency error signal, otherwise producing a predetermined signal.

104. A frequency discrimination method as defined in claim 101, further comprising the step of determining whether the frequency error signal indicates a frequency error less than or equal to a predetermined threshold, and if so, producing the frequency error signal, otherwise producing a predetermined signal.

105. Apparatus for determining a phase error in a received signal, comprising:

means for converting a received signal to first and second digital signals in quadrature relationship;

means, responsive to the first and second digital signals, for producing a magnitude signal indicative of whether the magnitude of the first digital signal is greater than the magnitude of the second digital signal; and phase detector means, receiving the first and second digital signals and the magnitude signal, for producing as a phase error signal a signal representative of the second digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal.

106. Apparatus as defined in claim 105, further comprising:

first determining means, receiving the phase error signal, for determining the difference between the current value of the phase error signal and a previous value of the phase error signal, and for producing a frequency error signal indicative thereof.

107. Apparatus as defined in claim 106, further comprising second determining means, receiving the frequency error signal, for determining whether the frequency error signal indicates a frequency error less than or equal to a predetermined threshold, and if so for producing the frequency error signal, otherwise producing a predetermined signal.

108. Apparatus as defined in claim 105, further comprising:

delay means receiving the phase error signal for producing a delayed phase error signal delayed by a predetermined amount; and subtracting means, receiving the phase error signal and the delayed phase error signal, for subtracting the phase error signal from the delayed phase error signal to produce a frequency error signal.

109. Apparatus as defined in claim 108, further comprising determining means, receiving the frequency error signal, for determining whether the frequency error signal indicates a frequency error less than or equal to a predetermined threshold, and if so for producing the frequency error signal, otherwise producing a predetermined signal.

110. A method for determining a phase error in a received signal, comprising the steps of:

converting a received signal to first and second digital signals in quadrature relationship;

responsive to the first and second digital signals, producing a magnitude signal indicative of whether the magnitude of the first digital signal is greater than the magnitude of the second digital signal; and digital signal exclusive-ORed with the inverse of the digital sign of the first digital signal if the magnitude of the first digital signal is greater than the magnitude of the second digital signal, otherwise producing, as the phase error signal, a signal representative of the first digital signal exclusive-ORed with the digital sign of the second digital signal.

111. A method as defined in claim 110, further comprising:

responsive to the phase error signal, determining the difference between the current value of the phase error signal and a previous value of the phase error signal; and producing a frequency error signal indicative thereof.

112. A method as defined in claim 111, further comprising the step of determining whether the frequency error signal indicates a frequency error less than or equal to a predetermined threshold, and if so, producing the frequency error signal, otherwise producing a predetermined signal.

113. A method as defined in claim 110, further comprising the steps of:

responsive to the phase error signal, producing a delayed phase error signal delayed by a predetermined amount; and responsive to the phase error signal and the delayed phase error signal, subtracting the phase error signal from the delayed phase error signal to produce a frequency error signal.

114. A method as defined in claim 113, further comprising the step of determining whether the frequency error signal indicates a frequency error less than or equal to a predetermined threshold, and if so producing the frequency error signal, otherwise producing a predetermined signal.

* * * * *

UNITED STATES PATENT AND TRADEMARK OFFICE
CERTIFICATE OF CORRECTION

PATENT NO : 5,982,821
DATED : November 9, 1999
INVENTOR(S): Kingston et al.

It is certified that error appears in the above-identified patent and that said Letters Patent is hereby corrected as shown below:

On the title page:

Item: [75] the inventors should include RANDAL REX SYLVESTER, West Valley, Utah

Signed and Sealed this

Twenty-sixth Day of December, 2000

Attest:

Q. TODD DICKINSON

*Attesting Officer*     *Director of Patents and Trademarks*